United States Patent
Tanaka et al.

(10) Patent No.: US 9,929,710 B2
(45) Date of Patent: Mar. 27, 2018

(54) LAMINATED COMPOSITE ELECTRONIC DEVICE INCLUDING COIL AND CAPACITOR

(71) Applicant: TDK Corporation, Tokyo (JP)

(72) Inventors: Masamichi Tanaka, Tokyo (JP); Tomokazu Ito, Tokyo (JP)

(73) Assignee: TDK Corporation, Tokyo (JP)

( * ) Notice: Subject to any disclaimer, the term of this patent is extended or adjusted under 35 U.S.C. 154(b) by 101 days.

(21) Appl. No.: 15/083,476

(22) Filed: Mar. 29, 2016

(65) Prior Publication Data
US 2016/0307702 A1 Oct. 20, 2016

(30) Foreign Application Priority Data
Apr. 14, 2015 (JP) .................. 2015-082730

(51) Int. Cl.
| | | |
|---|---|---|
| H03H 7/01 | (2006.01) | |
| H01G 4/40 | (2006.01) | |
| H01G 4/012 | (2006.01) | |
| H01F 17/00 | (2006.01) | |
| H03H 1/00 | (2006.01) | |

(52) U.S. Cl.
CPC ........... *H03H 7/0115* (2013.01); *H01G 4/012* (2013.01); *H01G 4/40* (2013.01); *H03H 7/1725* (2013.01); *H03H 7/1766* (2013.01); *H01F 17/0013* (2013.01); *H03H 2001/0085* (2013.01)

(58) Field of Classification Search
CPC . H03H 2001/0085; H03H 7/0115; H01G 4/40
USPC ................................. 333/175, 185
See application file for complete search history.

(56) References Cited

U.S. PATENT DOCUMENTS

| | | | |
|---|---|---|---|
| 6,476,689 B1 | 11/2002 | Uchida et al. | |
| 8,864,925 B2 | 10/2014 | Kimura et al. | |
| 8,970,325 B2 | 3/2015 | Ootsuka | |
| 9,107,323 B2 | 8/2015 | Tomaki et al. | |

(Continued)

FOREIGN PATENT DOCUMENTS

| | | |
|---|---|---|
| CN | 1196658 C | 4/2005 |
| JP | 2012-29015 | 2/2012 |
| JP | 2012-29016 | 2/2012 |

(Continued)

OTHER PUBLICATIONS

Office Action dated Sep. 12, 2017 in Taiwanese Patent Application No. 105108666.

*Primary Examiner* — Rakesh Patel
(74) *Attorney, Agent, or Firm* — Oblon, McClelland, Maier & Neustadt, L.L.P.

(57) ABSTRACT

A laminated composite electronic device has a circuit including a coil and a capacitor within a laminate having a plurality of conductor layers laminated with an insulating layer interposed between the respective ones of the conductor layers. The device includes a coil conductor arranged on a first conductor layer and forming part of the coil, and a pair of capacitor electrodes for forming the capacitor, one of which is arranged on a second conductor layer such that the one capacitor electrode laps over the coil conductor when viewed from a laminating direction of the laminate, wherein the coil conductor forms part of the coil, and simultaneously serves as the other of the pair of capacitor electrode for forming part of the capacitor.

9 Claims, 12 Drawing Sheets

(56) References Cited

U.S. PATENT DOCUMENTS

2016/0126917 A1* 5/2016 Ahn ..................... H03H 1/0007
333/185
2016/0149551 A1* 5/2016 Taniguchi ............ H03H 7/0115
333/185

FOREIGN PATENT DOCUMENTS

| JP | 2012-60440 | 3/2012 |
|----|------------|---------|
| JP | 2013-219469 | 10/2013 |

* cited by examiner

[SEVENTH CONDUCTOR LAYER]

LAMINATED COMPOSITE ELECTRONIC DEVICE INCLUDING COIL AND CAPACITOR

BACKGROUND OF THE INVENTION

The present invention relates to a laminated composite electronic device including a coil and a capacitor, and more particularly, to a composite electronic device which comprises a circuit including a coil and a capacitor within a laminate.

To respond to a demand for high-density mounting, composite electronic devices are nowadays provided by containing a plurality of passive elements within a single laminate chip to implement a variety of functions.

For example, a laminated filter comprises a filter circuit composed of a coil and a capacitor within a laminate having a plurality of conductor layers laminated with an insulating layer interposed between the respective conductor layers, thereby allowing for accomplishing such functions as signal processing, EMC countermeasures, and the like. The laminated filter is widely employed in a variety of electronic equipment such as a mobile telephone, a smart phone, a personal computer, and the like.

The following patent documents disclose such laminated composite electronic devices:
  Patent Document 1: JP-A-2012-29015;
  Patent Document 2: JP-A-2012-29016;
  Patent Document 3: JP-A-2012-60440; and
  Patent Document 4: JP-A-2013-219469.

SUMMARY OF THE INVENTION

With a reduction in size and thickness and higher functions of electronic equipment progressively realized in recent years, electronic devices employed in the electronic equipment are also required to provide high performances and to have a smaller size and a lower height. However, a reduction in size and height of a device may result in difficulties in ensuring a sufficient space for mounting each circuit element. As such, it is not easy to simultaneously provide a high performance and a reduction in size and height.

For example, a reduction of a laminated low pass filter in size and height will inevitably result in a smaller diameter of a coil and a consequently lowering Q-value and inductance value, thus encountering difficulties in improving the performance.

FIGS. 17 and 18 show the structure of a conventional device which has a laminated coil L composed of coil conductors L11-L14 and a capacitor C composed of capacitor electrodes C11, C12 disposed within internal conductor layers of a laminate. As shown in these figures, when the coil L and capacitor C are disposed side by side in the horizontal direction, the coil L is reduced in diameter, and moreover, the capacitor C disposed adjacent to the coil L prevents flux F of the coil L from passing, possibly resulting in degraded characteristics of the coil L and inability to sufficiently satisfy required characteristics.

On the other hand, the requirement for simultaneous accomplishment of such improved characteristics with the reduction in size and height is thought to be increased more and more in the future in step with the trend of pursuing a reduction in size and height, more functions, and higher functions for electronic equipment.

It is therefore an object of the present invention to provide a novel device structure for improving the characteristic of a coil in a laminated composite electronic device including a coil and a capacitor.

To solve the aforementioned problem and achieve the object, a laminated composite electronic device according to the present invention has a circuit including a coil and a capacitor electrically connected to each other within a laminate having a plurality of conductor layers laminated with an insulating layer interposed between the respective ones of the conductor layers. The device includes a coil conductor arranged on a first conductor layer included in the plurality of conductor layers to constitute at least a section of a conductor that forms part of the coil; and a pair of capacitor electrodes for forming the capacitor, where one of the capacitor electrodes is arranged on a second conductor layer included in the plurality of conductor layers different from the first conductor layer such that the one capacitor electrode laps over the coil conductor when viewed from a laminating direction of the laminate. The coil conductor forms part of the coil, and simultaneously serves as the other of the pair of capacitor electrodes for forming part of the capacitor.

In the laminated composite electronic device of the present invention, instead of arranging a coil and a capacitor side by side as in the aforementioned conventional structure (FIGS. 17 and 18), the capacitor electrodes are arranged such that they lap over the coil conductors within an area in which the coil is arranged (see FIGS. 1 through 5 later described), so that the present invention can save the area which would otherwise be required to arrange the capacitor, and can correspondingly increase the diameter of the coil to achieve a high inductance value. Additionally, the coil conductor can be increased in line width, thereby achieving a high Q-value. Furthermore, a chip can be reduced in size (reduction in size when viewed from the vertical direction). For clarity, in this application, a description will be made with a term "vertical direction" referring to a direction in which layers are laminated in a laminate, and a term "horizontal direction" referring to a direction parallel to each conductor layer and insulating layer.

Also, in the present invention, a coil conductor which forms part of the coil also serves as one of a pair of electrodes (capacitor electrodes) which form a capacitor. Since the capacitor electrodes are arranged to oppose this coil conductor in the vertical direction, it is possible to prevent the flux of the coil from being blocked by the capacitor electrodes.

For this purpose, the one capacitor electrode is preferably configured to have a width equal to or smaller than a line width of the coil conductor (identical or less than the line width of the coil conductor), and to be fitted within the line width of the coil conductor without running off therefrom when viewed from the vertical direction.

In one typical aspect of the present invention, the coil includes laminated coils which have coil conductors arranged on two or more conductor layers, and the capacitor electrodes are arranged to be sandwiched between these coil conductors.

More specifically, the laminated composite electronic device according to the present invention includes an other coil conductor different from the coil conductor arranged on the first conductor layer on a third conductor layer which is a conductor layer different from the first conductor layer and the second conductor layer, wherein the other coil conductor is electrically connected to the coil conductor arranged on the first conductor layer through an inter-layer connection conductor to form part of the coil together with the coil conductor arranged on the first conductor layer, the second conductor layer is a conductor layer laminated between the first conductor layer and the third conductor layer, and the one capacitor electrode arranged on the second conductor layer is positioned between the coil conductor arranged on the first conductor layer and the coil conductor arranged on the third conductor layer.

Also, in another aspect of the present invention, a laminated coil is provided as a coil in a similar manner to the foregoing aspect, but the capacitor electrode is arranged on the top side (on the topmost layer) or on the bottom side (on the lowermost layer) of the coil, instead of between coil conductors.

Specifically, the laminated composite electronic device according to the present invention includes an other coil conductor different from the coil conductor arranged on the first conductor layer on a third conductor layer different from the first conductor layer and the second conductor layer, wherein the other coil conductor is electrically connected to the coil conductor arranged on the first conductor layer through an inter-layer connection conductor to form part of the coil together with the coil conductor arranged on the first conductor layer, the second conductor layer is a conductor layer laminated on the opposite side to the third conductor layer from the first conductor layer with respect to the laminating direction of the laminate, and the one capacitor electrode arranged on the second conductor layer is positioned on the opposite side to the coil conductor arranged on the third conductor layer from the coil conductor arranged on the first conductor layer with respect to the laminating direction of the laminate.

Further, in the present invention, in any of the laminated composite electronic device according to the present invention or aspects, both the one capacitor electrode arranged on the second conductor layer and the section of the coil conductor arranged on the first conductor layer and forming part of the other capacitor electrode may have an L-like or a U-like (C-like) plane shape (shape viewed from the vertical direction).

While a coil conductor generally draws an L-like or U-like (C-like) pattern within a conductor layer, when a capacitor electrode is made to have an L-like or U-like (C-like) plane shape so as to extend along the coil conductor in such a shape, the coil conductor can be effectively utilized as a capacitor electrode to ensure a wide electrode area for a capacitor and achieve a sufficient capacitance.

Also, when a coil-integrated capacitor is designated for a capacitor made up of a capacitor electrode arranged to lap over a coil conductor, when viewed from the laminating direction of the laminate, and the coil conductor, as described above, in the present invention, the circuit implemented in the laminate may include two or more capacitors and one or more coil, where all the two or more capacitors may be coil-integrated capacitors.

It should be noted that the term "a circuit including a coil and a capacitor," as used herein, is typically a filter circuit, but is not necessarily limited to a filter circuit. This is because the present invention can be similarly applied to other circuits as long as they are circuits including a coil and a capacitor.

According to the present invention, the characteristic of a coil can be improved in a laminated composite electronic device including a coil and a capacitor.

BRIEF DESCRIPTION OF THE DRAWINGS

Other objects and features of the present invention will become apparent from the following detailed description considered in connection with the accompanying drawings. It should be apparent to those skilled in the art that the present invention is not limited to the undermentioned embodiment and a variety of modifications can be made within the scope of the claims. In the drawings, wherein similar reference characters denote similar elements throughout the several views:

DESCRIPTION OF THE EMBODIMENTS

[First Embodiment]

First, characteristic features of the present invention will be described as a first embodiment.

Figure 1:
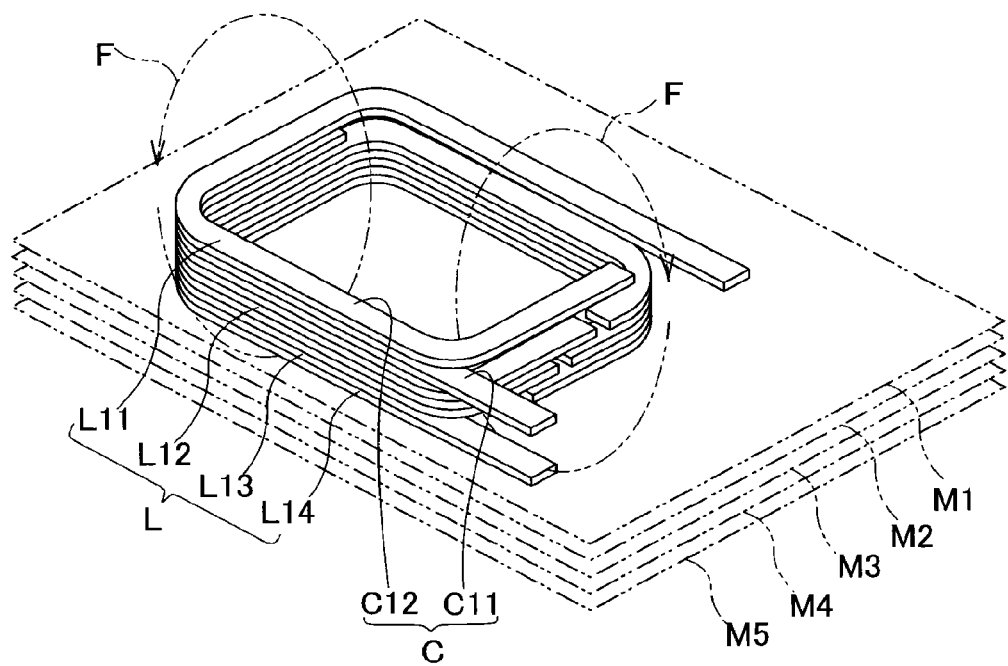
FIG. 1 is a perspective view showing an exemplary structure of an essential portion in a laminated composite electronic device according to a first embodiment of the present invention.
Figure 3:
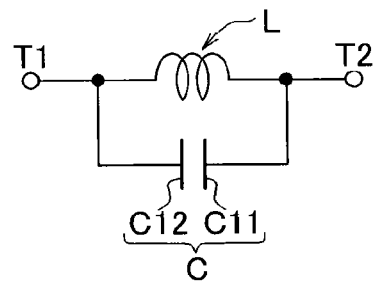
FIG. 3 is a circuit diagram of the exemplary structure shown in FIG. 1.
Figure 2:
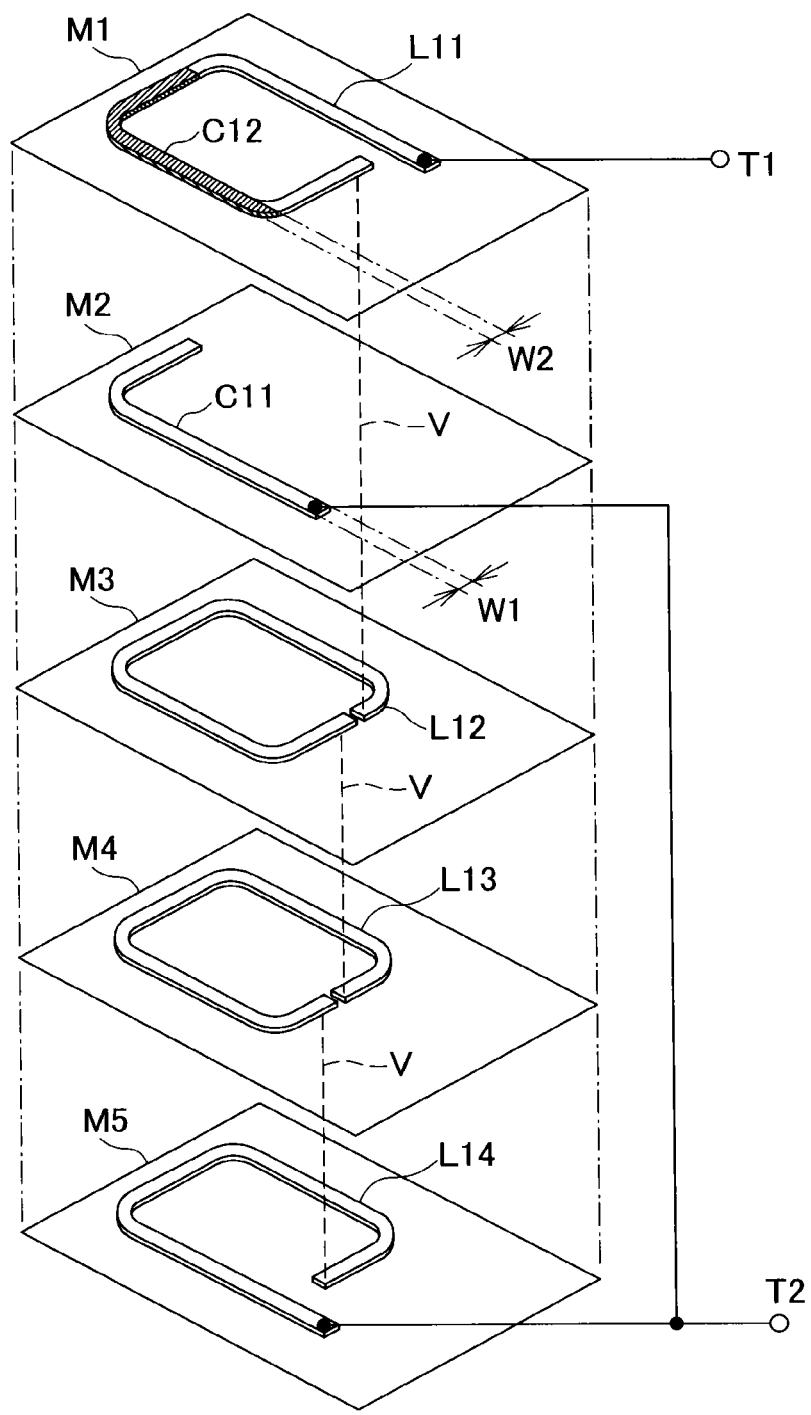
FIG. 2 is an exploded perspective view of the exemplary structure shown in FIG. 1.
Figure 17:
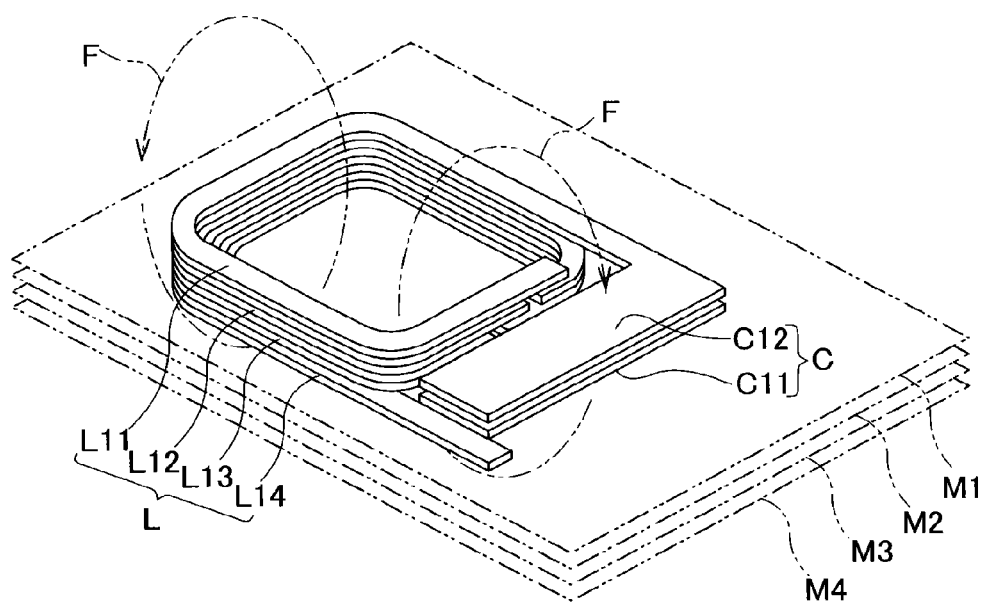
FIG. 17 is a perspective view showing an exemplary structure of an essential portion of a conventional laminated composite electronic device.
Figure 18:
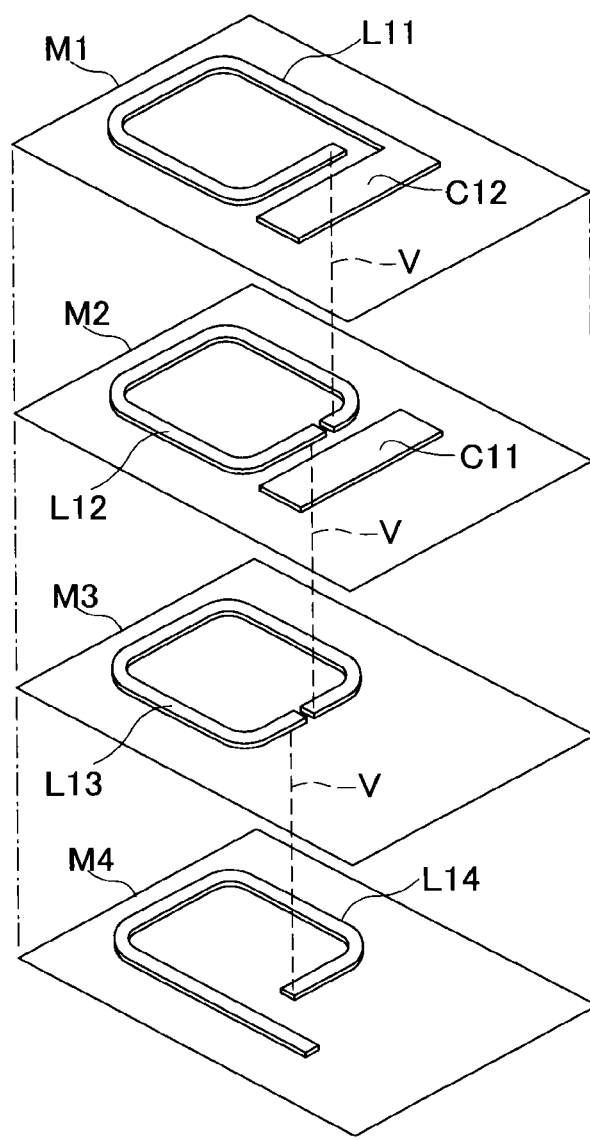
FIG. 18 is an exploded perspective view of the exemplary structure shown in FIG. 17.

FIGS. 1-3 illustrate characteristic features in a laminated composite electronic device according to the present invention. As shown in these figures, the aforementioned convention structure (FIGS. 17 and 18) comprises a coil L and a capacitor C disposed side by side (horizontally), while the embodiment of the present invention comprises a capacitor C between coil conductors L11, L12 which together form a laminated coil L by inserting a capacitor electrode C11 between the coil conductors L11, L12, and arranging the capacitor electrode C11 such that it laps vertically over the coil conductor L11.

Specifically, a laminate is made up of five conductor layers including a first conductor layer M1 through a fifth conductor layer M5 which are laminated with an insulating layer (not shown) inserted between the respective conductor layers M1-M5. Loop-shaped coil conductors L11, L12, L13, L14 are disposed on the first conductor layer M1, third conductor layer M3, fourth conductor layer M4, and fifth conductor layer M5, respectively, and are connected in order through via holes V (not shown in FIG. 1, and shown by broken lines in FIG. 2, and hereinafter simply called the "via") to complete a spiral laminated coil L.

On a second conductor layer M2 which vertically adjoins the first conductor layer M1 through an insulating layer, a capacitor electrode C11 is arranged to vertically oppose the coil conductor L11 arranged on the first conductor layer M1. This capacitor electrode C11 has an L-shaped plane shape and a width W1 which is equal to or less than a line width W2 of the coil conductor L11 (W1≤W2), such that the capacitor electrode C11 laps over part of the loop-shaped coil conductor L11 (partial line section of the coil conductor L11) arranged on the first conductor layer M1. With such a structure, the capacitor C can be made up of the capacitor electrode C11 arranged on the second conductor layer M2 and the coil conductor L11 arranged on the first conductor layer M1. The coil conductor L11 arranged on the first conductor layer M1 also serves as a capacitor electrode C12. Also, since the coil conductor L11 also serves as the capacitor electrode C12, the coil L is electrically connected with the capacitor C.

Notably, in order to prevent variations (errors) of the capacitor C in capacitance due to a shift in position between the capacitor electrode C11 and the coil conductor L11 (C12) possibly introduced by such causes as misalignment in the lamination of the conductor layers, preferably, the width W1 of the capacitor electrode C11 is smaller than the line width W2 of the coil conductor L11 (W1<W2), and the capacitor conductor C11 is fitted within the line width of the coil conductor L11. In other words, the entirety (whole width) of the capacitor electrode C11 is preferably fitted between both edges (both ends in the width direction) of the coil conductor L11 in the width direction, when viewed from a vertical direction.

Also, a dielectric film interposed in the coil integrated capacitor C (between the capacitor electrode C11 and the coil conductor L11 (C12)), i.e., the insulating layer (not shown) interposed between the first conductor layer M1 and the second conductor layer M2 may be, for example, a thin film mainly containing silicon nitride and alumina.

Then, as shown in FIG. 2, one end (an end opposite to an end which is connected to the coil conductor L12 on the third conductor layer M3) of the coil conductor L11 on the first conductor layer M1 may be connected to a terminal T1, and one end of the capacitor electrode C11 on the second conductor layer M2 and one end (an end opposite to an end which is connected to the coil conductor L13 on the fourth conductor layer M4) of the coil conductor L14 on the fifth conductor layer M5 may be respectively connected to a terminal T2, resulting in that an LC parallel circuit can be completed, as shown in FIG. 3.

Figure 5:
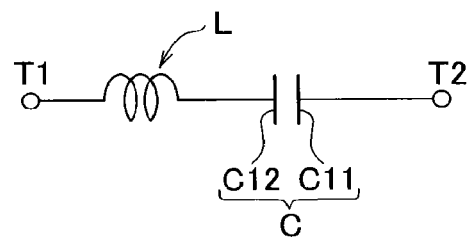
FIG. 5 is a circuit diagram showing the other exemplary structure shown in FIG. 4.
Figure 4:
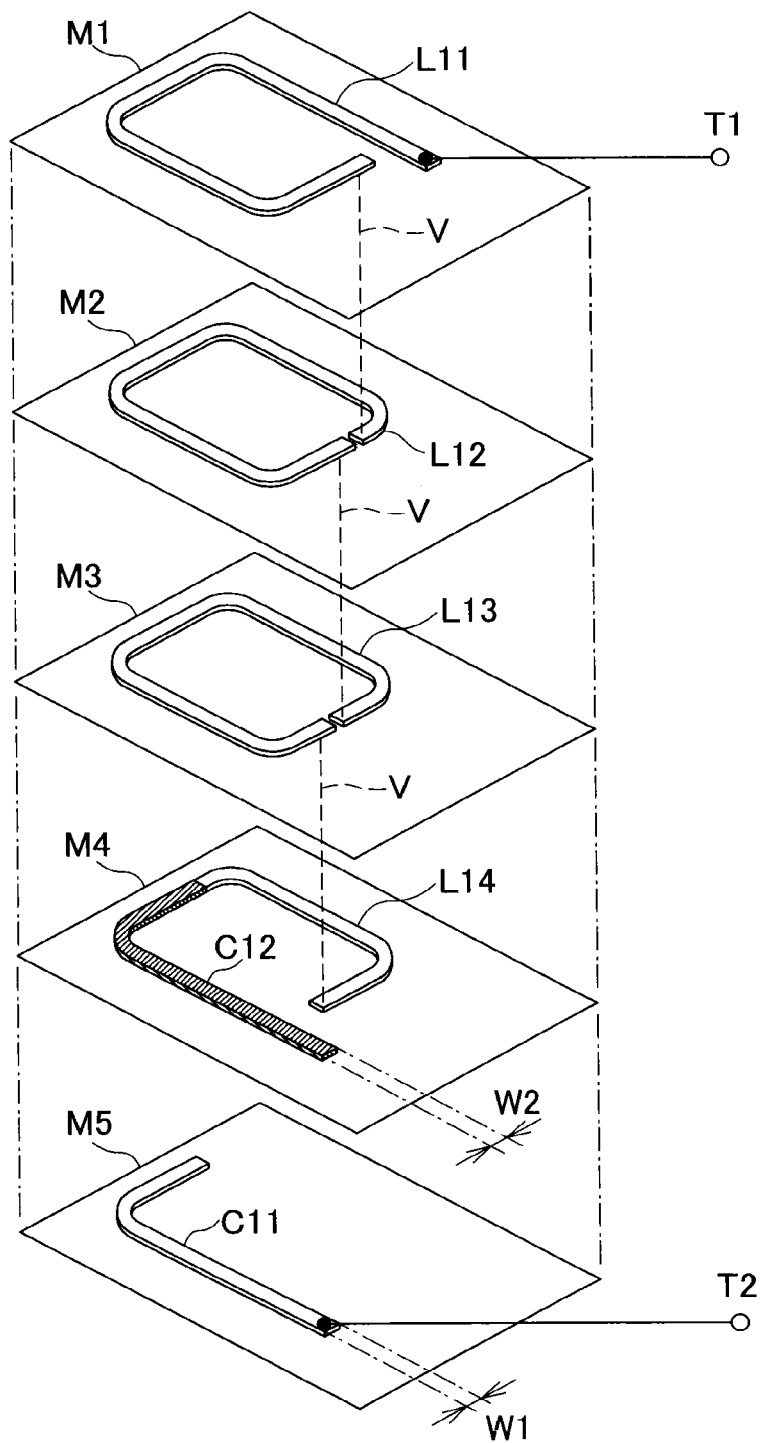
FIG. 4 is a perspective view showing another exemplary structure of the essential portion of the laminated composite electronic device according to the first embodiment in an exploded view.

Alternatively, as shown in FIG. 4, the capacitor electrode C11 may be arranged on the bottom side of the lowermost coil conductor L14 to form a coil-integrated capacitor C between the capacitor electrode C11 and the lowermost coil conductor L14, and the coil conductor L11 on the first conductor layer M1 may be connected to the terminal T1, and the capacitor electrode C11 to the terminal T2, respectively, resulting in that an LC series circuit is completed, as shown in FIG. 5, where the coil L (coil conductors L11-L14) and the capacitor C (capacitor electrodes C12, C11) are connected in series between the terminals T1 and T2.

Figure 6:
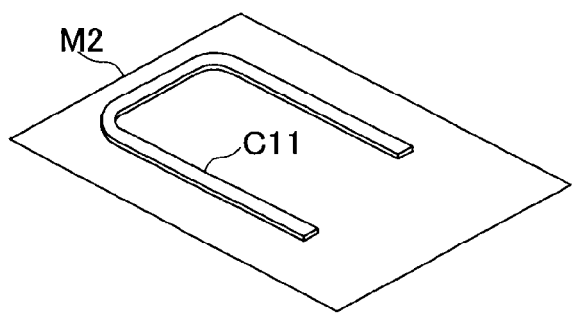
FIG. 6 is a perspective view showing another exemplary feature of a capacitor electrode.
Figure 7:
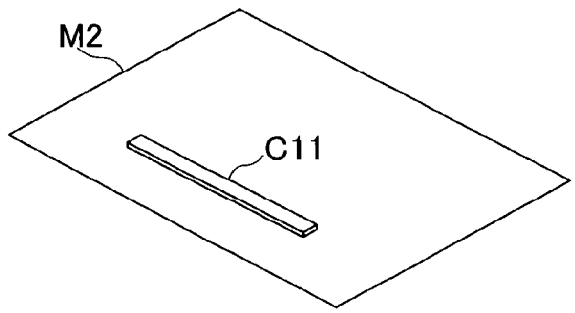
FIG. 7 is a perspective view showing a further exemplary feature of a capacitor electrode.
Figure 8:
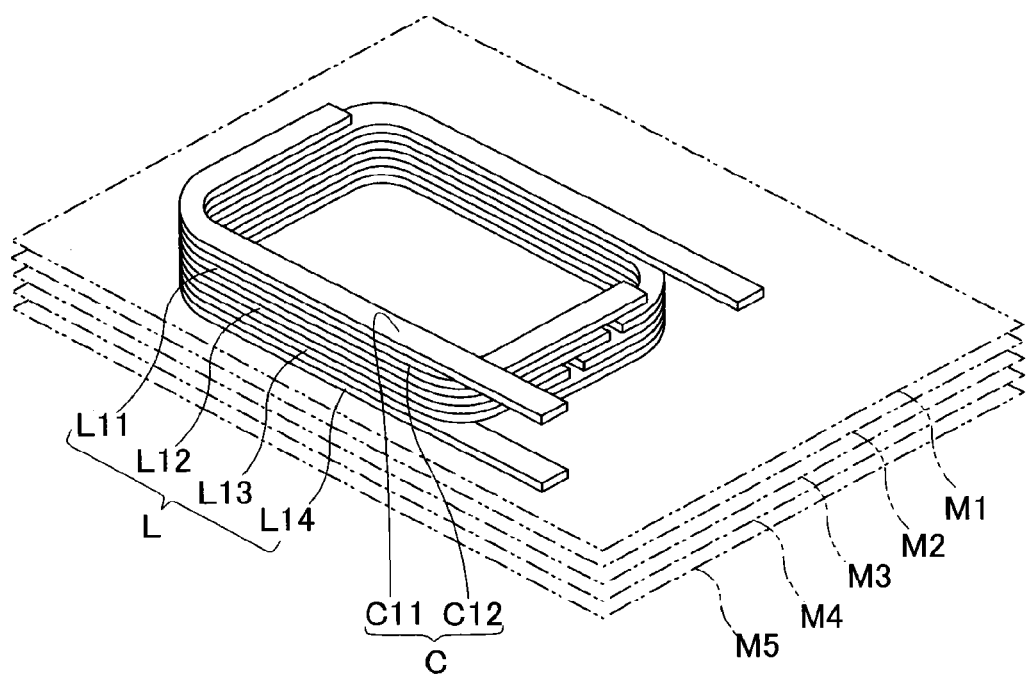
FIG. 8 is a perspective view showing an exemplary modification to the essential portion of the laminated composite electronic device according to the first embodiment.

The capacitor electrode C11 may have, a U-like plane shape (C-like plane shape), for example, as shown in FIG. 6, in conformity to the shape pattern of the coil conductor, or may have a linear plane shape, for example, a shown in FIG. 7. Further, as to a vertical position at which the capacitor electrode C11 may be arranged, instead of being arranged between the coil conductor L11 and the coil conductor L12 as described above, the capacitor electrode C11 may also be arranged on the top side of the topmost coil conductor L11, as shown in FIG. 8, to form the capacitor C between the capacitor electrode C11 and the topmost coil conductor L11.

Figure 9:
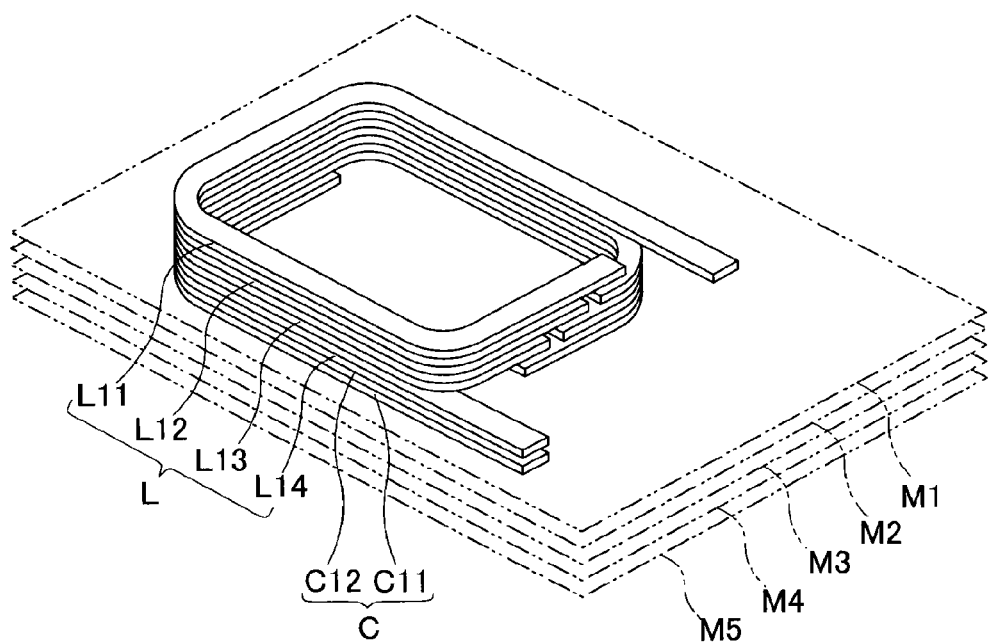
FIG. 9 is a perspective view showing another exemplary modification to the essential portion of the laminated composite electronic device according to the first embodiment.

Alternatively, as shown in FIGS. 4 and 9 described above, the capacitor electrode C11 may be arranged on the bottom side of the lowermost coil conductor L14 to form the capacitor C between the capacitor electrode C11 and the lowermost coil conductor L14.

It should be noted that in this embodiment the coil L is made up of four layers of coil conductors L11-L14, but the coil may be made up of three or less or five or more layers of coil conductors, or the coil can consist of a single layer of coil conductor. Also, a variety of circuits including a coil and a capacitor can be created by combining the structure of this embodiment with the connection methods (FIGS. 3 and 5).

[Second Embodiment]

A laminated composite electronic device according to a second embodiment of the present invention will now be described with reference to FIGS. 10 through 13.

A laminated composite electronic device 11 according to the second embodiment of the present invention is a laminated low-pass filter (hereinafter called the "LPF") circuit, implemented in a chip, which comprises an LC filter made up of conductor patterns within a laminate including a plurality of conductor layers laminated with an insulating layer interposed between the respective conductor layers.

Figure 10:
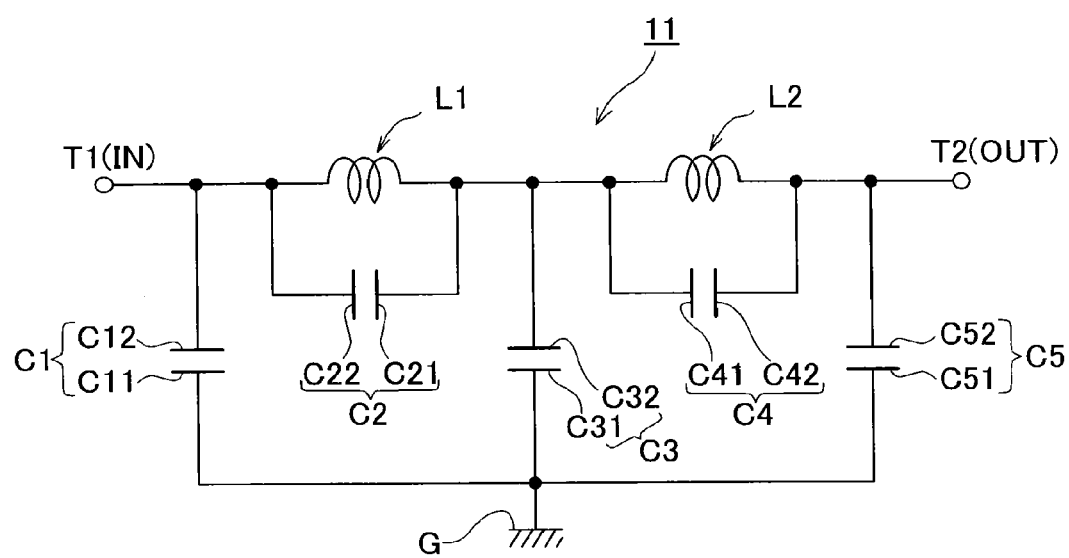
FIG. 10 is a circuit diagram showing a laminated composite electronic device according to a second embodiment of the present invention.

Specifically, as shown in FIG. 10, the circuit comprises two LC parallel circuits (a first LC resonant circuit made up of a coil L1 and capacitor C2 connected in parallel with each other, and a second LC resonant circuit made up of a coil L2 and a capacitor C4 connected in parallel with each other) connected in series between an input terminal T1 and an output terminal T2; a capacitor C1 having one end connected between the input terminal T1 and the first LC parallel circuit and the other end connected to a ground terminal G; a capacitor C3 having one end connected between the two LC parallel circuits and the other end connected to the ground terminal G; and a capacitor C5 having one end connected between the output terminal T2 and the second LC parallel circuit and the other end connected to the ground terminal G.

Figure 11:
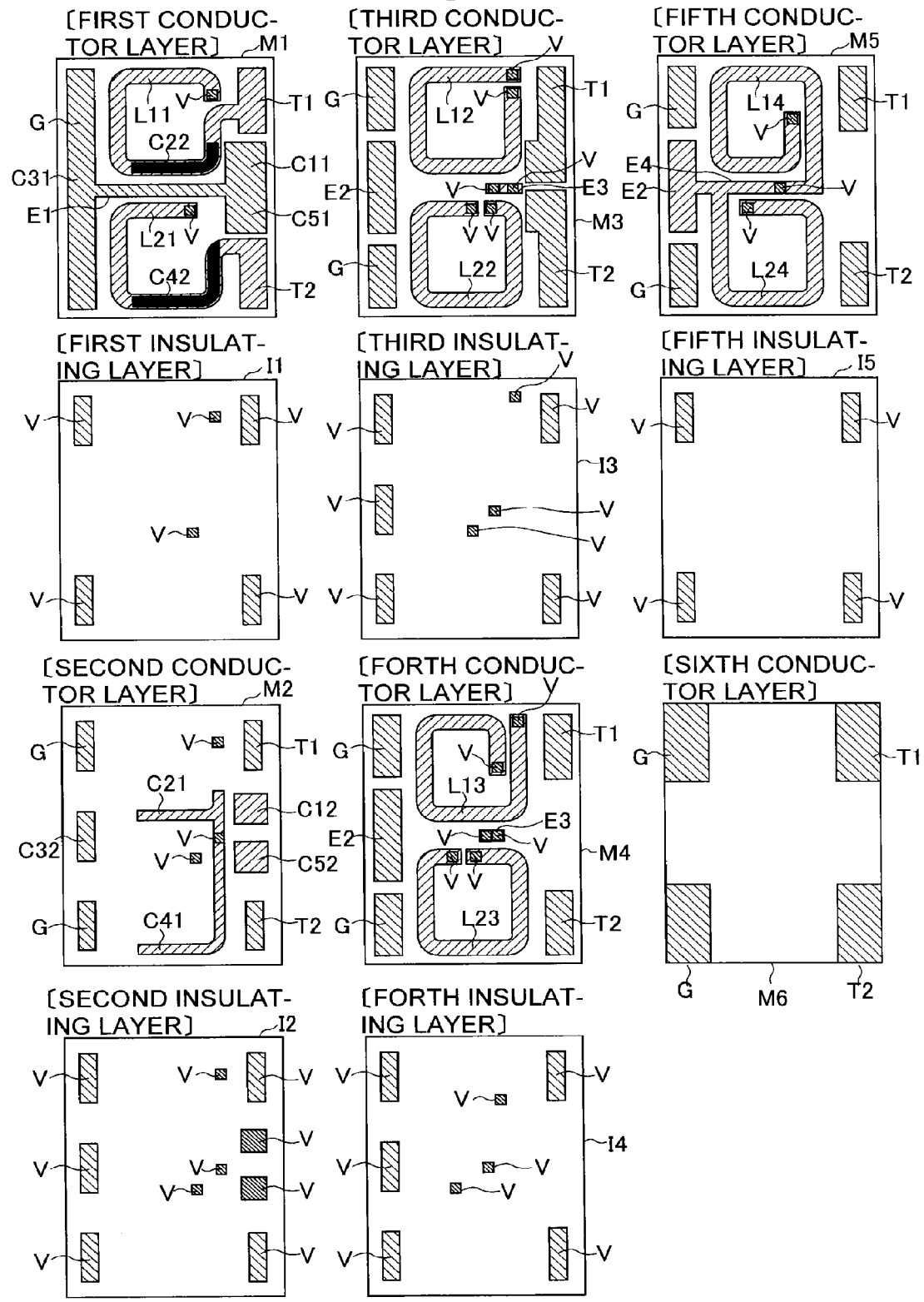
FIG. 11 includes plan views each showing a layer of a laminate in the laminated composite electronic device according to the second embodiment.

The laminate has a rectangular plane shape, as shown in FIG. 11, and comprises a first conductor layer M1, a first insulating layer I1, a second conductor layer M2, a second insulating layer I2, a third conductor layer M3, a third insulating layer I3, a fourth conductor layer M4, a fourth insulating layer I4, a fifth conductor layer M5, a fifth insulating layer I5, and a sixth conductor layer M6, which are laminated in order. The LPF according to this embodiment may comprise other conductor layers and insulating layers, not shown, for example, a conductor layer having a ground electrode and the like, in addition to the respective layers shown in FIG. 11.

The laminate comprises, at four corners thereof (four corners when viewed from the vertical direction), columnar conductors which extend vertically through the laminate from the first conductor layer M1 through the sixth conductor layer M6. These conductors comprise terminal zones T1, T2, G, appearing on the respective conductor layers M1-M6, and vias V extending through the respective insulating layers I1-I5 for connecting vertically adjoining terminal zones to each other to build columnar terminals. When designating the adjacent corners as a first through a fourth corner from the upper right corner of each layer in the counter-clockwise direction in FIG. 11, a columnar input terminal (input terminal zone T1) is positioned at the first corner; a columnar output terminal (output terminal zone T2) at the second corner; and columnar ground terminals (ground terminal zones G) at the third and fourth corners of these four corners, respectively.

Notably, the ground terminal zone G on the first conductor layer M1 is formed such that the ground terminal zone G at the third corner and the ground terminal zone G at the fourth corner continuously extend along a long side (left side) of the first conductor layer M1, in order to form the capacitor C3 (capacitor electrode C31, later described). Also, between the input terminal zone T1 and the output terminal zone T2, ground-side capacitor electrodes C11, C51 are arranged to form the capacitors C1 and C5, respectively, and the capacitor electrodes C11, C51 are connected to the ground terminal zone G on the first conductor layer M1 through a connection electrode E1. Further, a capacitor electrodes C12, C52 are arranged on the second conductor layer M2 such that they oppose the capacitor electrodes C11, C51 respectively through the first insulating layer I1, where the capacitor C1 is made up of the capacitor electrode C11 on the first conductor layer M1 and the capacitor electrode C12 on the second conductor layer M2, and the capacitor C5 is made up of the capacitor electrode C51 on the first conductor layer M1 and the capacitor electrode C52 on the second conductor layer M2.

Also, in one of two areas of the laminate equally divided in the longitudinal direction, as viewed from the vertical direction of the laminate (upper half of each layer in FIG. 11), a laminated coil L1 is arranged to forms part of the first LC resonant circuit. This laminated coil L1 is created by connecting in order loop-shaped coil conductors L11, L12, L13, L14 respectively arranged on the first, third, fourth, and fifth conductor layers M1, M3, M4, M5 through vias V respectively extending through the first insulating layer I1, second conductor layer M2, second insulating layer I2, third insulating layer I3, and fourth insulating layer I4.

Further, in the other of the two equally divided areas (lower half of each layer in FIG. 11), a laminated coil L2 is arranged to form part of the second LC resonant circuit. Like the laminated coil L1 described above, this laminated coil L2 is created by connecting in order loop-shaped coil conductors L21, L22, L23, L24 respectively arranged on the first conductor layer M1 and the third through fifth conductor layers M3-M5 through vias V respectively extending through the first insulating layer I1, second conductor layer M2, and second through fourth insulating layers I2-I4.

Notably, the laminated coil L1, which forms part of the first LC resonant circuit, is spirally routed downward such that it turns clockwisely from the input terminal zone T1 arranged at the first corner of the first conductor layer M1 toward the fifth conductor layer M5. Then, the laminated coil L1 is connected to the laminated coil L2 which forms part of the second LC resonant circuit through a connection electrode E4 arranged on the fifth conductor M5 between both coils L1, L2. On the other hand, the laminated coil L2, which forms part of the second LC resonant circuit, is spirally routed upward such that it turns counter-clockwisely from the connection electrode E4 on the fifth conductor M5 toward the first conductor layer M1, and connected to the output terminal zone T2 arranged at the second corner on the first conductor layer M1.

Also, a capacitor electrode C32 is arranged on the second conductor layer M2 so as to oppose a central area of the ground terminal zone G continuously formed on the first conductor layer M1 through the first insulating layer I1. This capacitor electrode C32 forms the capacitor C3 together with the ground terminal zone G (capacitor electrode C31) on the first conductor layer. The capacitor electrode C32 is connected to the respective laminated coils L1, L2 through the vias V formed through the second through fourth insulating layers I2-I4, electrodes E2 arranged on the third through fifth conductor layers M3-M5, and connection electrode E4 arranged on the fifth conductor layer M5. Connection electrodes E3 are arranged on the third and fourth conductor layers M3, M4 for connecting the vias V to each other on the respective conductor layers M3, M5.

The capacitor C2 which forms part of the first LC resonant circuit, and the capacitor C4 which forms part of the second LC resonant circuit are coil-integrated capacitors as described above.

Specifically, a capacitor electrode C21 extending in an L-shape is arranged on the second conductor layer M2 so as to lap over a section of the coil conductor L11 on the first conductor layer M1. This capacitor electrode C21 has a width smaller than the line width of the coil conductor L11, and is arranged to be fitted within the line width of the coil conductor L11, when viewed from the vertical direction, opposite to the coil conductor L11 to form the capacitor C2 therewith through the first insulating layer I1. Notably, the capacitor electrode C21 is continuous to a capacitor electrode C41, next described, for electric connection. Also, the section of the coil conductor L11 opposite to the capacitor electrode C21 is indicated by blacking out the section (the same is applied to the coil-integrated capacitor as well). This section functions as the coil conductor L11 and simultaneously functions as the capacitor electrode C22 which forms part of the capacitor C2. Also, the coil L1 (coil conductor L11) is electrically connected to the capacitor C2 through this section of the capacitor electrode C22.

Likewise, the capacitor C4 comprises, on the second conductor layer M2, a capacitor electrode C41 which extends in an L-shape so as to lap over a section of the coil conductor L21 on the first conductor layer M1. This capacitor electrode C41 has a width smaller than the line width of the coil conductor L21, and is arranged to be fitted within the line width of the coil conductor L21, when viewed from the vertical direction, opposite to the coil conductor L21 (blacked-out section C42) to form the capacitor C4 therewith through the first insulating layer I1. In this process, when the capacitor electrodes C21, C41 are chosen to be smaller in width than the coil conductor L11, L21 and are fitted within the line width of the coil conductors L11, L21, as previously described, the capacitors C2, C4 can be prevented from experiencing capacitance errors due to misalignment in lamination and the like. Also, the capacitors C2, C4 (capacitor electrodes C21, C41) will never block the flux of the coils L1, L2.

Figure 16:
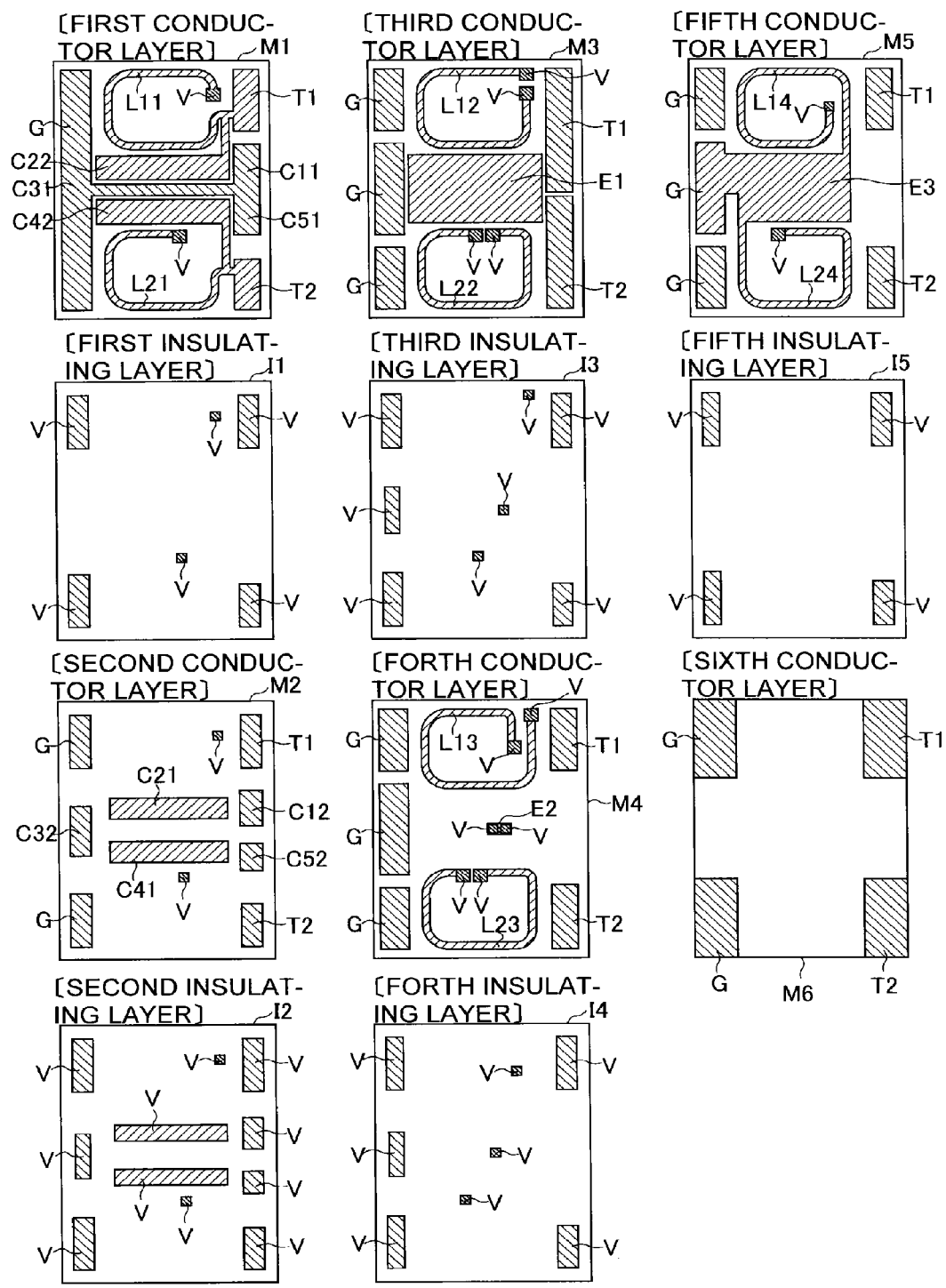
FIG. 16 includes plan views each showing a layer of a laminate in a laminated composite electronic device according to a comparative example.

For comparison with this embodiment, a laminated LPF (comparative example) was created with a coil and a capacitor arranged side by side in the horizontal direction as has been traditionally done. FIG. 16 shows this comparative example. As shown in FIG. 16, the LPF according to this comparative example employs capacitors C1-C5, including a capacitor C2 included in a first LC resonant circuit and a capacitor C4 included in a second LC resonant circuit, which are all implemented by conventionally known ordinary capacitors (which have two capacitor electrodes opposite to each other), rather than coil-integrated capacitors. These capacitors C1-C5 are arranged in a central area of the laminate in the longitudinal direction, when viewed from the vertical direction, and include laminated coils L1 (L11-L14) and L2 (L21-L24), respectively, on both sides of the capacitors C1-C5, i.e., on both ends of the laminate in the longitudinal direction, when viewed from the vertical direction.

Figure 12:
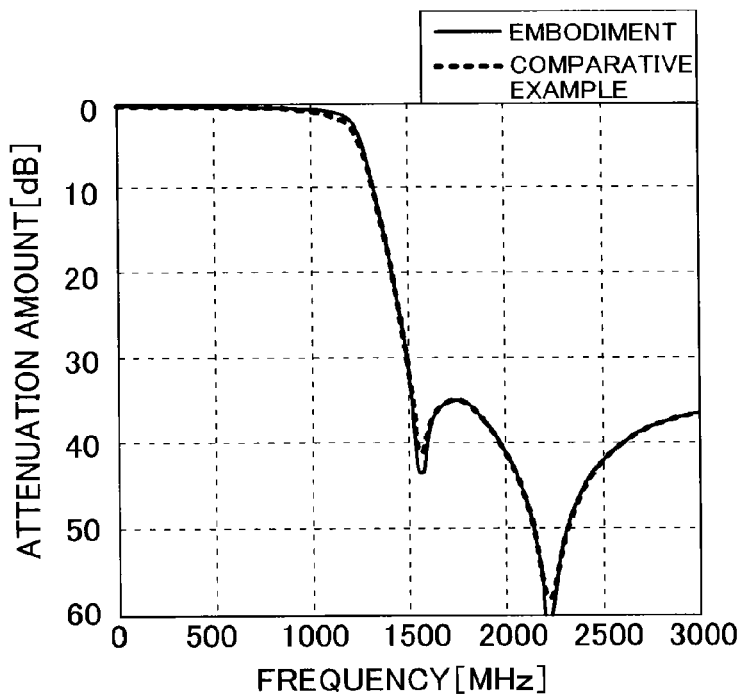
FIG. 12 is a graph representing an attenuation characteristic of the laminated composite electronic device according to the second embodiment.
Figure 13:
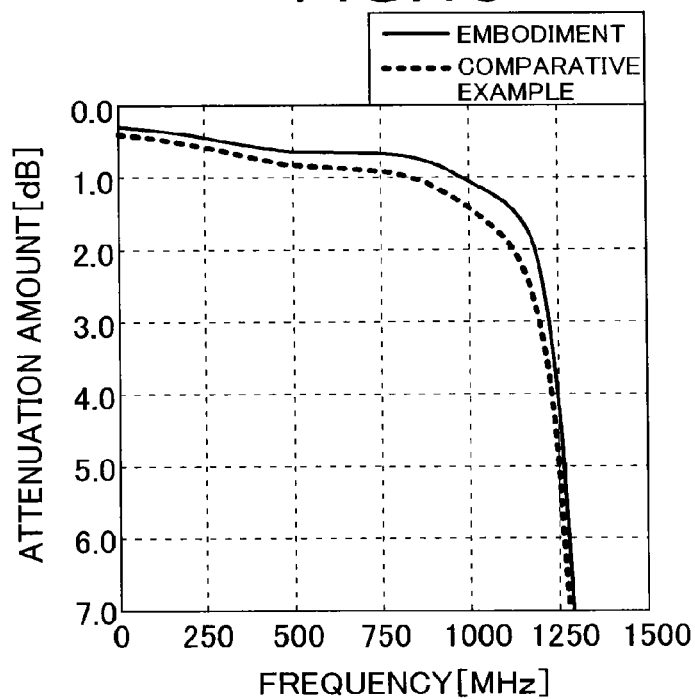
FIG. 13 is a graph showing part of the graph represented in FIG. 12 in an enlarged view.

FIGS. 12 and 13 are graphs representing the frequency-attenuation characteristic of the comparative example and the LPF according to the second embodiment. As is apparent from these graphs, it can be seen that, according to the structure of this embodiment, an insertion loss can be reduced to improve the filter characteristic, as compared with the comparative example. Also, as to the Q-value, the comparative example exhibits 14, while this embodiment exhibits 20 and can thus increase the Q-value. These improved characteristics are thought to be accomplished by virtue of the structure of the embodiment which allows the coils L1, L2 to be increased in diameter and the coil conductors L11-L14, L21-L24 to be increased in line width.

[Third Embodiment]

A laminated LPF according to a third embodiment of the present invention will be described with reference to FIG. 14.

Figure 14:
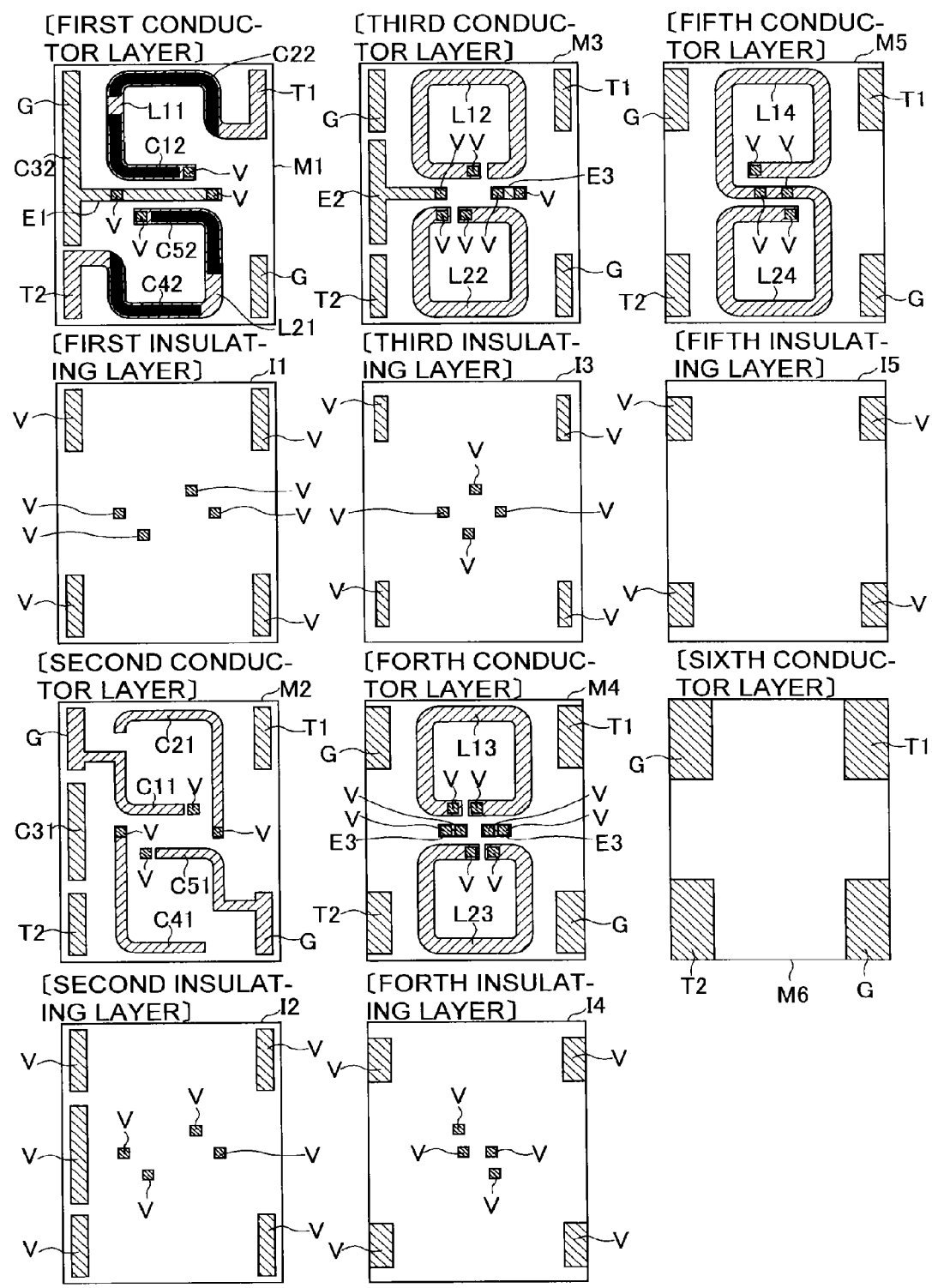
FIG. 14 includes plan views each showing a layer of a laminate in a laminated composite electronic device according to a third embodiment of the present invention.

As shown in FIG. 14, the LPF of this embodiment, like the second embodiment, employs coil-integrated capacitors for a capacitor C2 of a first LC resonant circuit and a capacitor C4 of a second LC resonant circuit, and in addition to these, employs coil-integrated capacitors for a capacitor C1 and a capacitor C5 as well.

Specifically, like the second embodiment, a coil conductor L11 forming part of a coil L1 of the first LC resonant circuit, and a coil conductor L21 forming part of a coil L2 of the second LC resonant circuit are arranged on a first conductor layer M1. In this structure, a capacitor electrode C11 of a capacitor C1 and a capacitor electrode C21 of a capacitor C2 are arranged on a second conductor layer M2 so as to oppose the coil conductor L11 of the first LC resonant circuit, thereby forming the capacitor C1 between the capacitor electrode C11 and section C12 of the coil conductor L11, and forming the capacitor C2 between the capacitor electrode C21 and another section C22 of the coil conductor L11.

Likewise, a capacitor electrode C41 of the capacitor C4 and a capacitor electrode C51 of the capacitor C5 are arranged on the second conductor layer M2 so as to oppose the coil conductor L21 of the second LC resonant circuit, thus forming the capacitor C4 between the capacitor electrode C41 and section C42 of the coil conductor L21 and the capacitor C5 between the capacitor electrode C51 and another section C52 of the coil conductor L21, respectively.

Notably, this embodiment differs from the second embodiment in that a ground terminal zone G is positioned at a second corner, and an output terminal zone T2 is positioned at a third corner, in order to implement the capacitors C1, C5 as coil-integrated capacitors.

[Fourth Embodiment]

A laminated LPF according to a fourth embodiment of the present invention will be described with reference to FIGS. 15A and 15B.

Figure 15A:
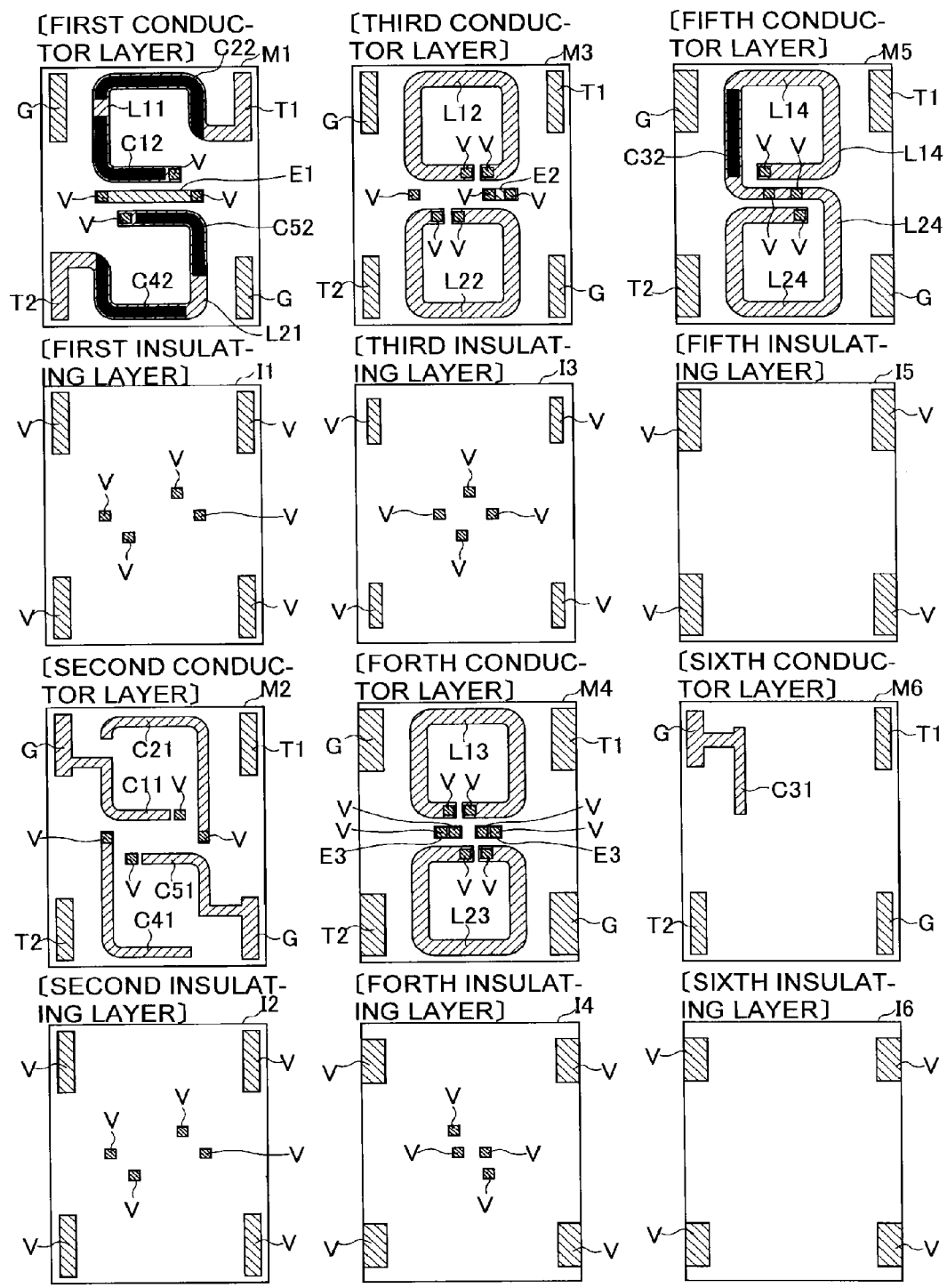
FIG. 15A includes plan views each showing a layer (first conductor layer through sixth insulating layer) of a laminate in a laminated composite electronic device according to a fourth embodiment of the present invention.
Figure 15B:
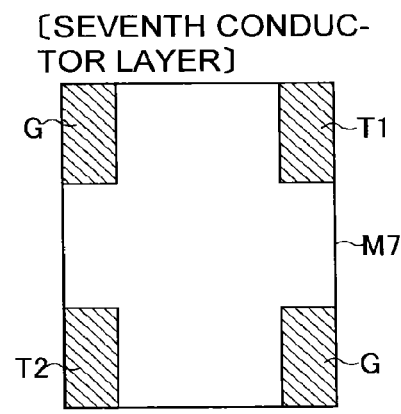
FIG. 15B is a plan view showing a layer (seventh conductor layer) of the laminate in the laminated composite electronic device according to the fourth embodiment.

As shown in FIGS. 15A and 15B, the LPF of this embodiment employs coil-integrated capacitors for all capacitors C1-C5 included in an LPF circuit (FIG. 3).

Specifically, like the third embodiment, the capacitor C1 and capacitor C2 are formed of a coil conductor L11 (C12, C22) of a first LC resonant circuit arranged on a first conductor layer M1 and capacitor electrodes C11, C21 arranged on a second conductor layer M2, and additionally the capacitor C4 and capacitor C5 are formed of a coil conductor L21 (C42, C52) of a second LC resonant circuit arranged on the first conductor layer M1, and capacitor electrodes C41, C51 arranged on the second conductor layer M2.

Further, for implementing the capacitor C3 as a coil-integrated capacitor, a capacitor electrode C31 is arranged on a sixth conductor layer M6 so as to lap over a coil conductor L14 which forms part of a coil L1 of the first LC resonant circuit arranged on a fifth conductor layer M5, when viewed from the vertical direction. This capacitor electrode C31 is connected to a ground terminal zone G arranged at the fourth corner of the sixth conductor layer M6, and opposes section C32 of the coil conductor L14 arranged on the fifth conductor layer M5 through the fifth insulating layer I5 to form the capacitor C3.

What is claimed is:

1. A laminated composite electronic device having a circuit including a coil, a first capacitor and a second capacitor electrically connected to one another within a laminate having a plurality of conductor layers laminated with an insulating layer interposed between respective ones of the plurality of conductor layers, said device comprising:

a coil conductor arranged on a first conductor layer included in said plurality of conductor layers, said coil conductor being at least a section of a conductor that forms is part of said coil;

a pair of capacitor electrodes for forming said first capacitor; and a pair of capacitor electrodes for forming said second capacitor, wherein one of said pair of capacitor electrodes for forming said first capacitor and one of said pair of capacitor electrodes for forming said second capacitor are arranged on a second conductor layer included in said plurality of conductor layers different from said first conductor layer such that said one capacitor electrode for said first capacitor and said one capacitor electrode for said second capacitor overlap with said coil conductor when viewed from a laminating direction of said laminate;

said coil conductor comprises a loop-shaped conductor; and said loop-shaped conductor includes a first capacitor double-use area that serves as an other capacitor electrode for said first capacitor, and a second capacitor double-use area that serves as an other capacitor electrode for said second capacitor.

2. The laminated composite electronic device according to claim 1, wherein:

one or both of said one capacitor electrode for said first capacitor and said one capacitor electrode for said second capacitor has a width equal to or smaller than a line width of said coil conductor, and is completely overlapped with said coil conductor when viewed from the laminating direction of said laminate.

3. The laminated composite electronic device according to claim 2, further comprising:
an other coil conductor different from said coil conductor, arranged on a third conductor layer different from said first conductor layer and said second conductor layer, wherein
said other coil conductor is electrically connected to said coil conductor through an inter-layer connection conductor to form part of said coil together with said coil conductor;
said second conductor layer is laminated between said first conductor layer and said third conductor layer; and
said one capacitor electrode for said first capacitor and said one capacitor electrode for said second capacitor are positioned between said coil conductor and said other coil conductor.

4. The laminated composite electronic device according to claim 1, further comprising:
an other coil conductor different from said coil conductor, arranged on a third conductor layer different from said first conductor layer and said second conductor layer, wherein
said other coil conductor is electrically connected to said coil conductor through an inter-layer connection conductor to form part of said coil together with said coil conductor;
said second conductor layer is laminated between said first conductor layer and said third conductor layer; and
said one capacitor electrode for said first capacitor and said one capacitor electrode for said second capacitor are positioned between said coil conductor and said other coil conductor.

5. The laminated composite electronic device according to claim 1, wherein:
both said one capacitor electrode for said first capacitor and said first capacitor double-use area have an L-like plane shape.

6. The laminated composite electronic device according to claim 5, wherein:
both said one capacitor electrode for said second capacitor and said second capacitor double-use area have an L-like plane shape.

7. The laminated composite electronic device according to claim 5, wherein:
both said one capacitor electrode for said second capacitor and said second capacitor double-use area have a U-like plane shape.

8. The laminated composite electronic device according to claim 1, wherein:
both said one capacitor electrode for said first capacitor and said first capacitor double-use area have an U-like plane shape.

9. The laminated composite electronic device according to claim 1, wherein:
said circuit is a filter circuit.

* * * * *